(12) United States Patent
Breyta et al.

(10) Patent No.: US 7,790,350 B2
(45) Date of Patent: Sep. 7, 2010

(54) METHOD AND MATERIALS FOR PATTERNING A NEUTRAL SURFACE

(75) Inventors: Gregory Breyta, San Jose, CA (US); Matthew E. Colburn, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 550 days.

(21) Appl. No.: 11/882,163

(22) Filed: Jul. 30, 2007

(65) Prior Publication Data

US 2009/0035668 A1    Feb. 5, 2009

(51) Int. Cl.
*G03F 7/00* (2006.01)
*G03F 7/004* (2006.01)

(52) U.S. Cl. .............. 430/270.1; 430/273.1; 430/312; 430/330; 430/331

(58) Field of Classification Search .......... 430/270.1, 430/273.1, 312, 330, 331
See application file for complete search history.

(56) References Cited

U.S. PATENT DOCUMENTS

| | | | |
|---|---|---|---|
| 5,372,912 A * | 12/1994 | Allen et al. | 430/270.1 |
| 5,625,020 A | 4/1997 | Breyta et al. | |
| 5,801,094 A | 9/1998 | Yew et al. | |
| 6,042,997 A | 3/2000 | Barclay et al. | |
| 6,268,436 B1 | 7/2001 | Chen et al. | |
| 6,277,546 B1 | 8/2001 | Breyta et al. | |
| 6,303,263 B1 | 10/2001 | Chen et al. | |
| 6,548,219 B2 * | 4/2003 | Ito et al. | 430/270.1 |
| 6,784,110 B2 | 8/2004 | Breyta et al. | |
| 6,794,110 B2 | 9/2004 | Breyta et al. | |
| 6,911,400 B2 | 6/2005 | Colburn et al. | |
| 6,926,953 B2 * | 8/2005 | Nealey et al. | 428/220 |
| 6,930,034 B2 * | 8/2005 | Colburn et al. | 438/619 |
| 7,015,149 B2 | 3/2006 | Woo | |
| 7,071,097 B2 | 7/2006 | Colburn | |
| 7,071,099 B1 | 7/2006 | Colburn et al. | |
| 7,521,094 B1 * | 4/2009 | Cheng et al. | 427/532 |
| 2006/0172514 A1 | 8/2006 | Gambino et al. | |
| 2006/0231525 A1 | 10/2006 | Asakawa et al. | |
| 2008/0193658 A1 * | 8/2008 | Millward | 427/401 |
| 2008/0274413 A1 * | 11/2008 | Millward | 430/5 |
| 2008/0299353 A1 * | 12/2008 | Stoykovich et al. | 428/195.1 |
| 2008/0311347 A1 * | 12/2008 | Millward et al. | 428/144 |

OTHER PUBLICATIONS

Mansky, P.; "Ordered Diblock Copolymer Films on Random Copolymer Brushes", Macromolecules, 1997, pp. 6810-6813, 30(22), ACS Publications, USA.

* cited by examiner

*Primary Examiner*—Amanda C. Walke
(74) *Attorney, Agent, or Firm*—R. J. Eichelburg; The Law Offices of Robert J. Eichelburg

(57) ABSTRACT

A self assembly step for the manufacture of an electronic component comprising, e.g., a semiconductor chip or semiconductor array or wafer comprises forming a block copolymer film placed on a random copolymer film substrate operatively associated with the electronic component and the block copolymer film wherein the surface energy of the random copolymer film is tailored by use of a photolithographic or chemical process prior to the self assembly step. By prior deterministic control over regional surface properties of the random copolymer film, domains of the block copolymer film form only in predefined areas. This approach offers simplified processing and a precise control of regions where domain formation occurs. Selective removal of some of the domains allows for further processing of the electronic component.

20 Claims, 8 Drawing Sheets

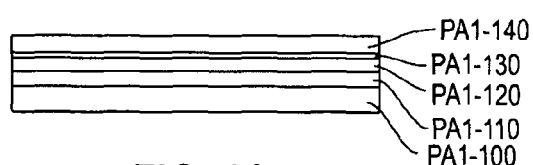
FIG. 1A
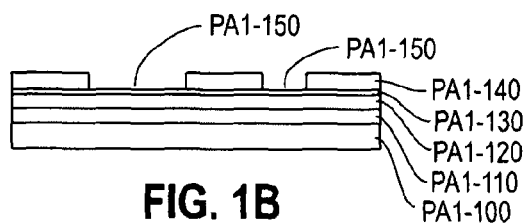
FIG. 1B
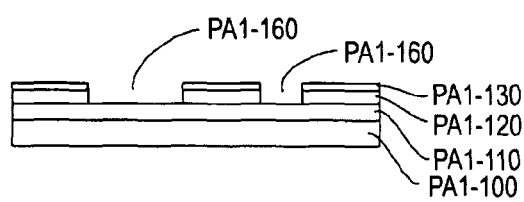
FIG. 1C
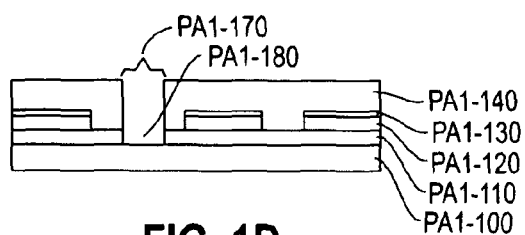
FIG. 1D
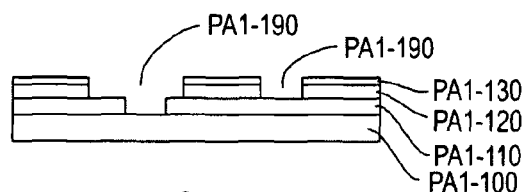
FIG. 1E
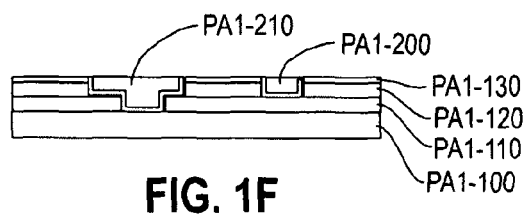
FIG. 1F
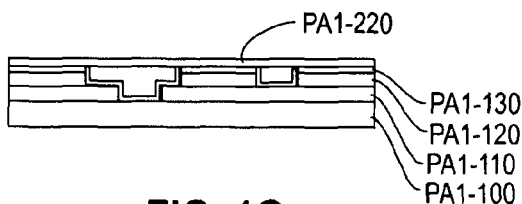
FIG. 1G
FIG. 1
Prior Art

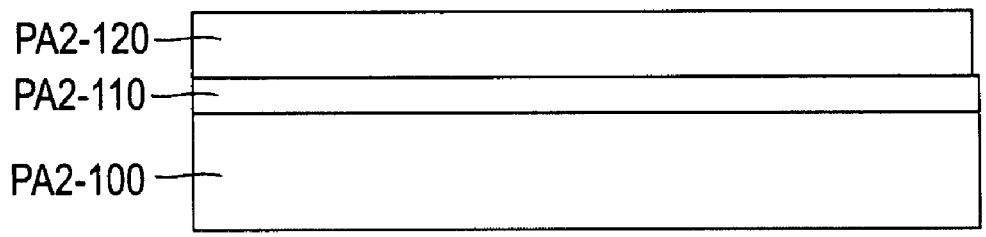
FIG. 2A
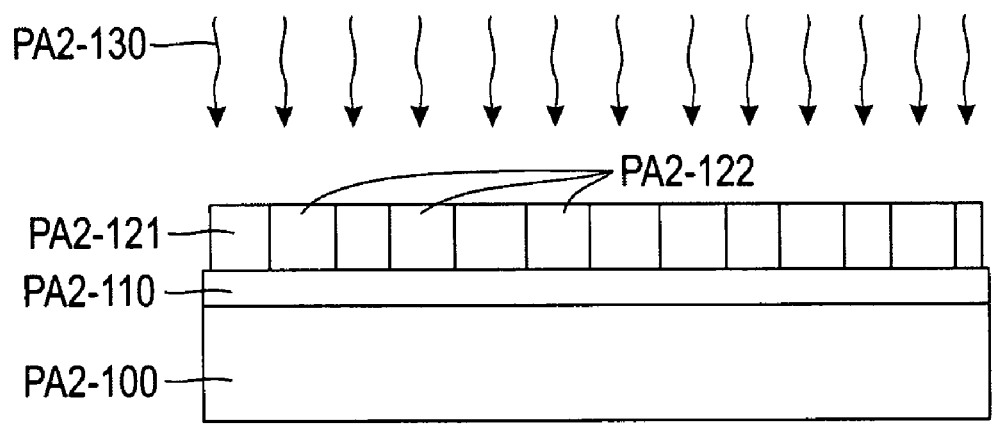
FIG. 2B
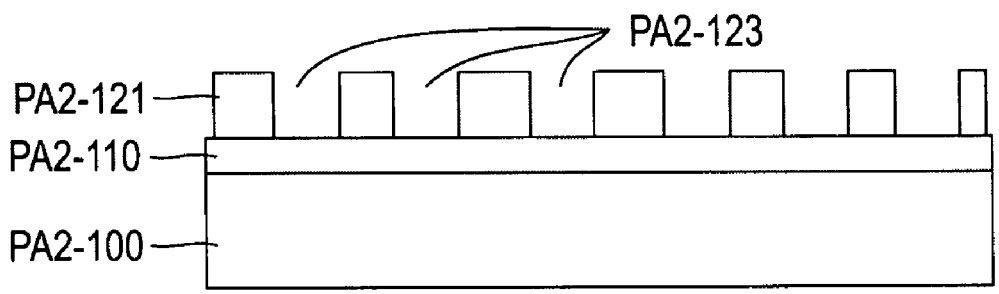
FIG. 2C
FIG. 2
Prior Art Prior Art
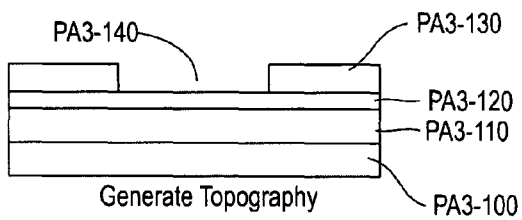
Generate Topography
FIG. 3A
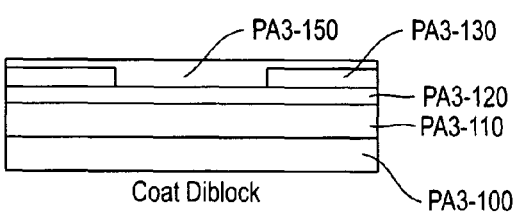
Coat Diblock
FIG. 3B
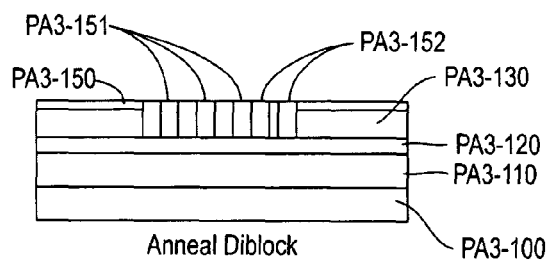
Anneal Diblock
FIG. 3C
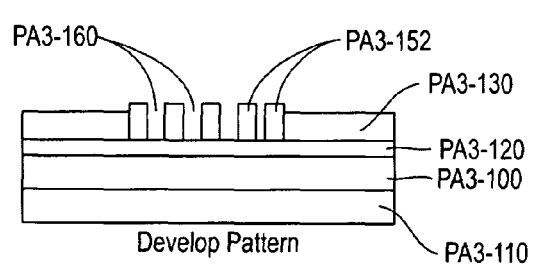
Develop Pattern
FIG. 3D
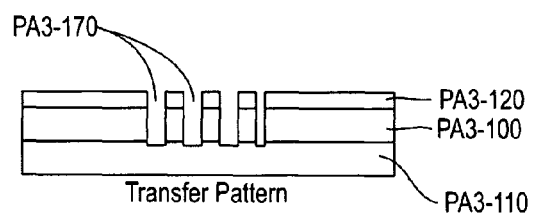
Transfer Pattern
FIG. 3E
FIG. 3
Prior Art

FIG. 4A
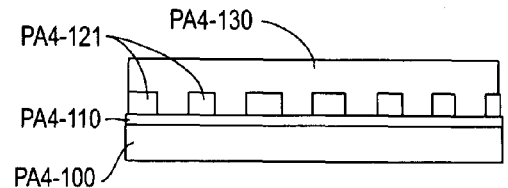
FIG. 4E
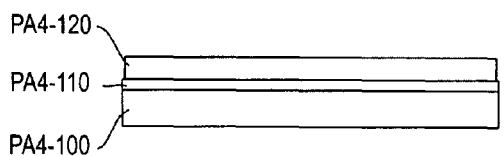
FIG. 4B
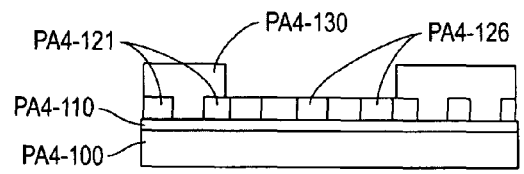
FIG. 4F
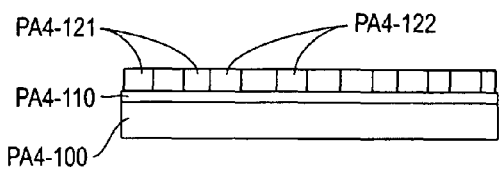
FIG. 4C
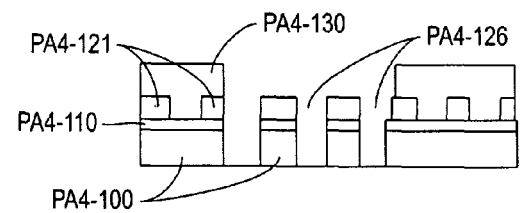
FIG. 4G
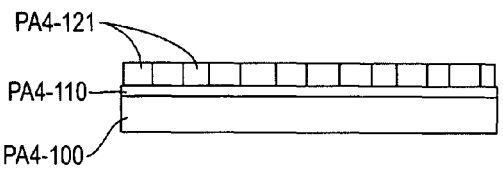
FIG. 4D
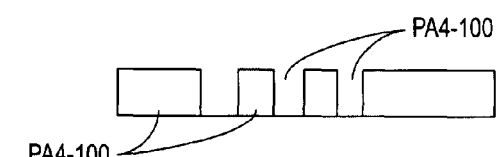
FIG. 4H
Blockout Mask Approach
FIG. 4
Prior Art

FIG. 5A
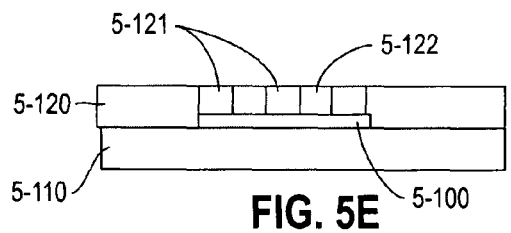
FIG. 5E
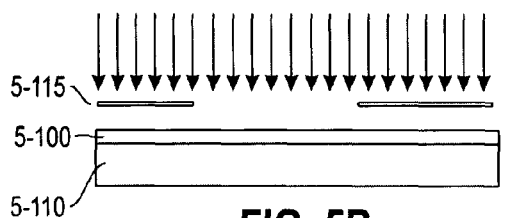
FIG. 5B
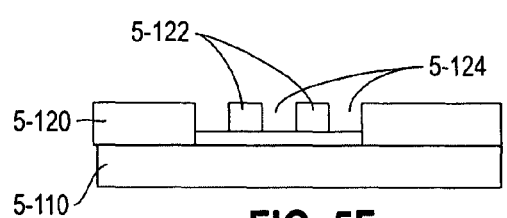
FIG. 5F
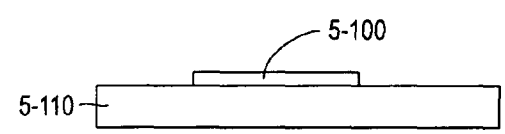
FIG. 5C
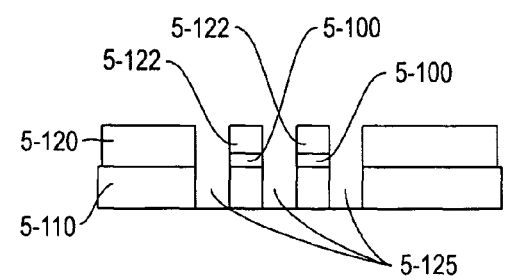
FIG. 5G
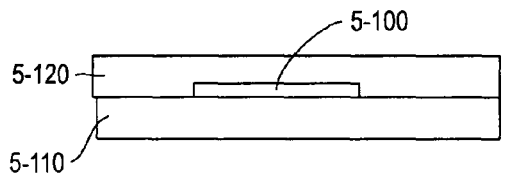
FIG. 5D
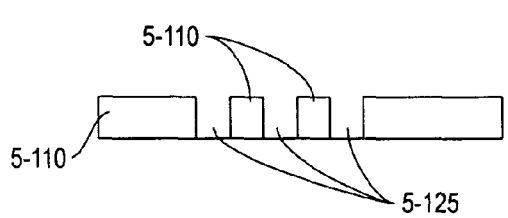
FIG. 5H
Photolytic Definition of Neutral Surface
FIG. 5

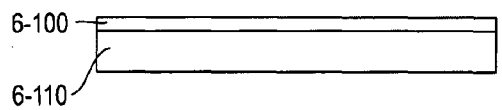
FIG. 6A
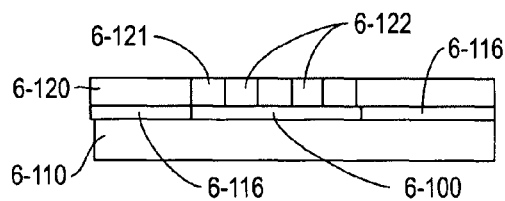
FIG. 6E
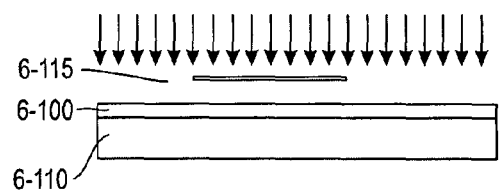
FIG. 6B
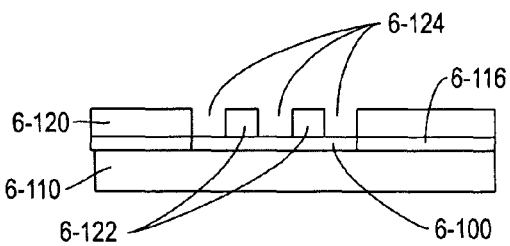
FIG. 6F
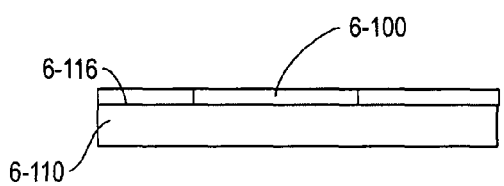
FIG. 6C
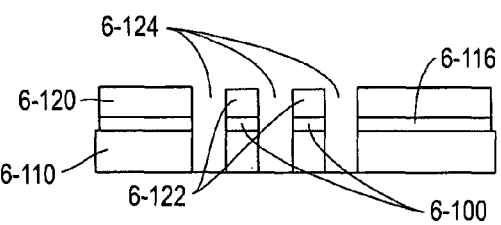
FIG. 6G
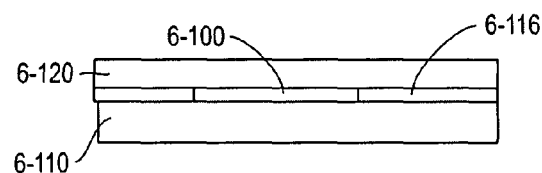
FIG. 6D
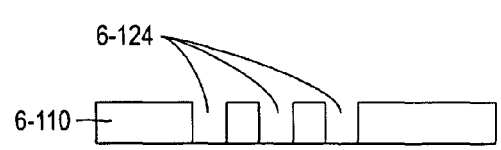
FIG. 6H
Photolytic Definition of Neutral Surface
FIG. 6

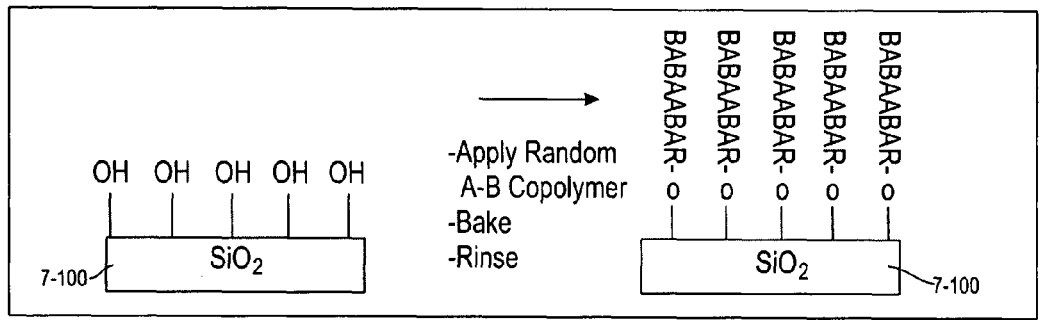
FIG. 7A
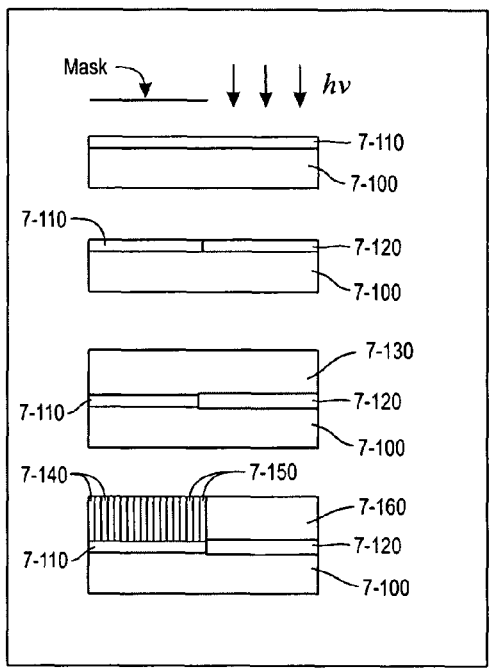
FIG. 7B
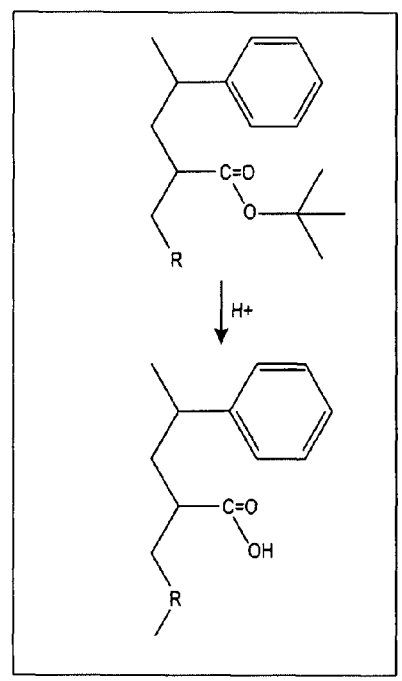
FIG. 7C
Examples
FIG. 7

FIG. 4A
FIG. 5A
FIG. 5C
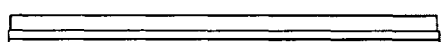
FIG. 4B
FIG. 5D
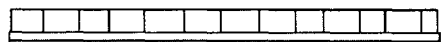
FIG. 4C
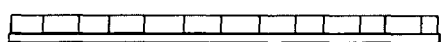
FIG. 4D
FIG. 5E
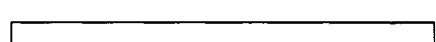
FIG. 4E
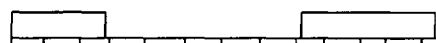
FIG. 4F
FIG. 5F
FIG. 4G
FIG. 5G
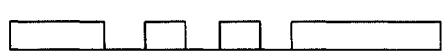
FIG. 4H
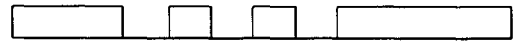
FIG. 5H
FIG. 8 Comparison of Process

METHOD AND MATERIALS FOR PATTERNING A NEUTRAL SURFACE

DESCRIPTION OF THE INVENTION

1. Field of the Invention

The field of the invention comprises convolved self-assembled structures such as nanostructures, and the fabrication of such structures by processes such as deterministic patterning processing methods, e.g., deterministic photolithography, which comprises the use of a master, such as a photolithographic mask to direct self-assembly in a predetermined location. Ion beam etching and other etch techniques known in the art can also be employed.

More specifically, and in one aspect, the fabrication comprises the generation of nanostructures by photolithography to pre-define regions in the structure where self assembly takes place.

2. Background of the Invention

The advancement of semiconductor computational speed has largely been driven by the ever smaller dimensions of semiconductor transistors and other integrated circuit (IC) components brought about by scaling their dimensions and/or properties.

Most of these processes rely on separate patterning steps to create pre-existing patterns over which a self-assembled film is subsequently formed. See, Black, C. T., et al. "Integration of Self-Assembled diblock Copolymers for Semiconductor Fabrication," Applied *Physics Letters* 79 400-411 (2001). Recent technical literature in this field, however, shows attempts by the industry to combine such patterning steps. The smaller dimensions of IC components have also created interest in reducing the size of IC interconnects or wiring interconnects in these types of circuits. One process of creating an interconnect wiring network comprises the dual damascene (DD) process, schematically shown in FIG. 1.

As with any circuit, chips are prone to signal propagation which varies with the product of the line resistivity, R, of the chip's interconnector wires where R refers to the resistivity of the wiring in the Dual Damascene component, and interlayer dielectric (ILD) capacitance, C. An increase in the product of line resistance multiplied by ILD capacitance reduces the likelihood of signal propagation and vice-versa. Manufacturers, in order to improve the performance of semiconductor chips, however, have reduced the resistivity (R) of the interconnector wires by replacing aluminum wiring with copper, and have also moved to lower dielectric constant (k) materials for the ILD, resulting in a reduction of the capacitance, C. In any event, the reduction of R or C or both results in a reduction of the product of R×C in the chip, thereby increasing the likelihood of unwanted signal propagation.

The common terminology used to classify dielectric films falls into four categories: standard k (4.5<k<10), low k (k<3.0), ultra low k (k<<2.5), and extreme low k (k<2.0). Ultra low k and extreme low k dielectrics generally tend to be porous with intentionally engineered voids in their structure. Since the lowest dielectric constant possible comprises air or vacuum ($k_{vac}$=1) the industry has developed means to produce voids in the dielectric. When the void volume extends and occupies substantial contiguous regions of the gaps between the lines of wires of a chip component, one achieves an interconnect structure where these lines are nominally separated by air or vacuum as the ILD material. We employ the term air bridge or air-gap to describe such an interconnect structure to distinguish it from structures which employ a porous ILD with void volume dispersed randomly within a nominally contiguous solid dielectric. Colburn et al. U.S. Pat. No. 6,930,034 further describes processes of placing air gaps or air bridges in a semiconductor chip or semiconductor array or wafer or IC components.

Black et al. (supra) describes the use of so-called "bottom-up" fabrication of semiconductor components as do Liddle, J. A. et al., "Lithographically directed self-assembly of nanostructures," J. Vac. Sci. Technol. B 22(6), 3409-3414, (November/December 2004); Thurn-Albrecht, T. et al., "Ultrahigh Density Nanowire Arrays Grown in Self-Assembled diblock Copolymer Templates," *Science* 290, 2126-2129 (2000); and Schaffer, E. et al., "Electrically Induced Structure Formation and Pattern Transfer," *Nature* 403, 874-877 (2000). One process uses block copolymers for generating sub-optical ground rule patterns. Another comprises forming a "honeycomb structure" within a poly (methylmethacrylate-block-styrene) (PMMA-b-PS) diblock copolymer. In the case of a cylindrical phase diblock copolymer having a minor component of PMMA, upon thermal annealing the PMMA block can phase-separate to vertically oriented cylinders within the matrix of the PS block. (Thurn-Albrecht et al., Schaffer et al., and Black et al. (supra)).

Since diblock copolymers have a natural length scale associated with their molecular weight and composition, the morphology of a phase-separated diblock copolymer can be used to generate cylinders of a specific width and on a specific pitch. Irradiating the diblock copolymer with UV causes the PMMA to decompose into smaller molecules (Thurn-Albrecht et al. and Schaffer et al. (supra)). Further developing with glacial acetic acid removes these small molecules. Other processes simply employ glacial acetic acid (e.g., Black et al. (supra)). A third process uses an oxygen plasma for preferentially etching the diblock copolymer. For example, an oxygen plasma will preferentially remove PMMA at a higher rate than PS in a PMMA-b-PS diblock copolymer.

Recently, Ober et al. (P. Du, M. Li, K, Douki, X. Li, C. Garcia, A. Jain, D-M Smilgies L. Fetters, S. Gruner, U. Wiesner, C. Ober, "Additive-driven Phase-Selective Chemistry in block Copolymer Thin Films: The convergence of Top-down and Bottom-up Approaches" Adv. Mat. 16 (12) 953 (2004)) described a process of selectively crosslinking a diblock copolymer using a UV light source followed by baking to remove the minority phase.

A review of the technical literature and known processes show a need to have the ability to isolate regions where the benefits of self assembly occur, e.g., defining isolated regions where the formation of vertical domains is required on a substrate for subsequent transfer etch. Ming, L. and Ober, C. K., "Block copolymer patterns and templates," *Materials Today*, Vol. 9, Number 9, pp. 30-39 (2006); Colburn et al., U.S. Pat. No. 6,911,400; and Asakawa et al., U.S. Patent Application Publication US 2006/0231525 A1 describe some of the diblock copolymers useful in this regard. Some fabrication processes may also require defining areas where no transfer etch occurs on the substrate. Recent disclosures also describe a blockout mask process requiring additional processing steps compared to conventional processes, wherein a blockout mask of photoresist is used over the polymer layer where self assembly has taken place. This process suffers from the additional complexity, processing steps, material, and equipment introduced into the conventional process steps in order to obtain the results from a blockout procedure.

Improved interconnect fabrication techniques for these components employ the so-called "dual damascene" process illustrated by Colburn, U.S. Pat. No. 7,071,097; Gambino et al. U.S. Patent Application 2006172514, Aug. 3, 2006; Woo, U.S. Pat. No. 7,015,149; and Yew et al., U.S. Pat. No. 5,801, 094. Other photolithographic processes and compositions for self assembled semiconductor chips or semiconductor arrays or wafers or IC components are further described by Greco et al., U.S. Pat. No. 7,071,099; Colburn et al., U.S. Pat. No. 6,930,034; Colburn et al., U.S. Pat. No. 6,911,400; Breyta et al., U.S. Pat. No. 6,784,110; Chen et al., U.S. Pat. No. 6,303,263; Breyta et al., U.S. Pat. No. 6,277,546; Chen et al., U.S. Pat. No. 6,268,436; Barclay et al., U.S. Pat. No. 6,042,997; and Breyta et al., U.S. Pat. No. 5,625,020.

While all of the foregoing provide advancements in the fabrication of semiconductor chips, arrays, wafers, and IC structures, referred to hereafter as electronic components (which comprise precursors of electronic components, i.e., articles of manufacture known in the art that are converted into such electronic components), there is still a need for improved or novel materials and processes for combining the self assembled structure and deterministic photolithography.

SUMMARY OF THE INVENTION

The present invention provides materials and processes for combining a self assembled structure and deterministic photolithography as described herein, as well as articles of manufacture, and products produced by such processes that address these needs.

The written description, abstract of the disclosure, claims, and drawings of the invention as originally set out herein, set forth the features and advantages and objects of the invention, and point out how they may be realized and obtained. Additional objects and advantages of the invention may be learned by practice of the invention.

To achieve these and other advantages and objectives, and in accordance with the purpose of the invention as embodied and described herein, the invention comprises an electronic component and a process for manufacturing such electronic component utilizing a diblock copolymer film supported or coated on a random copolymer film neutral surface or substrate, wherein the surface energy requirements of the underlying random copolymer film neutral surface or substrate are tailored by a photolithographic process prior to a self assembly step that utilizes the diblock copolymer. The invention addresses the properties of the surface of the random copolymer film or substrate whereas the self assembly step involves the application of the diblock copolymer which occurs subsequent to the "tailoring" operation. Accordingly, the surface properties of the random copolymer film neutral surface or substrate are tailored to the specific diblock. Some prior art systems form vertical structures without the "tuned" or tailored surface. The present invention in one aspect also comprises the manufacture of the "tailored" or patterned "neutral" surface in a way so that it is used to deter formation as well.

We tailor the surface energy of the random copolymer film neutral surface or substrate by changing the molecular structure of the neutral surface. Typically, and as described in the technical literature, a neutral surface has a composition intermediate between the two blocks in the diblock copolymer. The neutral surface is not the diblock copolymer, but rather a random copolymer on which the diblock copolymer is placed. This aspect of the invention extends beyond diblock copolymers to tri blocks, as well as copolymers having four blocks, or five blocks or more, all of which comprise aspects of the present invention. We modify the surface of the random copolymer when we do this, i.e., we cause chemical and/or physical reactions or changes to take place on the surface in patterning the surface. There are several processes for performing the patterning. In one embodiment, the patterned neutral surface is rendered insoluble in the casting film of the diblock copolymer. One process for this comprises crosslinking using a small co-monomer in the neutral surface. This can be readily done with common epoxies, ureas, or acrylates, to name just a few.

By prior deterministic control over regional surface areas, domains form only in predefined areas. Domains refer to the micro (typically <100 nm) 3D structure formed by the diblock copolymers and their equivalents. These can be lines, or spheres, or cylinders in a matrix phase that when projected or viewed on one plane appear as lines or circles. This approach offers greatly simplified processing and a process for precise control of regions where domains form.

Thus in one embodiment the invention comprises a process for using actinic radiation to pattern a template for polymeric self assembly of a diblock copolymer film in a self assembly step for the manufacture of an electronic component. This comprises placing a diblock copolymer film on a random copolymer film substrate wherein the random copolymer film substrate is operatively associated with an electronic component and the diblock copolymer film. By "operatively associated" we mean the film functions to enhance the properties of the diblock copolymer and the substrate or is adhered to both the substrate and the diblock copolymer in a way that allows for chemical and or physical modification of either the substrate and/or the diblock copolymer to achieve the ends of this invention. Prior to self assembly of the diblock copolymer film, we tailor the surface energy of the random copolymer film by means of a photolithographic process by employing actinic radiation to form a pattern in, and provide deterministic control over regional surface properties of, the random copolymer film thereby promoting domain formation in the diblock copolymer film only in predefined areas, which is followed by forming a self assembled structure in the diblock copolymer film.

The random copolymer film comprises a photo definable energetically neutral copolymer film used to control regions of self assembly and may comprise a copolymer film having labile protecting groups. Heating attaches the random copolymer to the electronic component and/or cross links it. It can be photolyzed to deprotect the labile protecting groups, which generates an acid and changes the polarity in the photolyzed region. It can also be optionally treated to remove a region of the film. The diblock copolymer film is coated on top of the random copolymer film to produce a combined self assembled pattern.

BRIEF DESCRIPTION OF THE DRAWINGS

The accompanying drawings, incorporated in and which constitute a part of this specification, illustrate single and multiple embodiments of the invention, and together with the other parts of the specification, serve to explain the objects, advantages and principles of the invention.

FIG. 1a to FIG. 1g of FIG. 1 comprise side elevations in cross section of an electronic component that schematically illustrate a prior art general dual damascene process for producing integrated circuit interconnects.

FIG. 2a to FIG. 2c of FIG. 2 comprise side elevations in cross section of an electronic component that schematically illustrate a prior art process for generating vertically oriented columns in a self assembled film placed on a substrate of suitable surface energy adhesion and inertness to allow application of a diblock copolymer film and formation of a self assembled structure on the electronic component.

FIG. 3a to FIG. 3e of FIG. 3 comprise side elevations in cross section of an electronic component that schematically illustrate a prior art process for generating an oriented self assembled film over a topography of the electronic component.

FIG. 4a to FIG. 4h of FIG. 4 comprise side elevations in cross section of an electronic component that schematically illustrate a prior art process of employing a blackout mask to control the definition of regions of utility of a self assembled diblock copolymer structure used as an etch mask.

FIG. 5a to FIG. 5h of FIG. 5 comprise side elevations in cross section of an electronic component that schematically illustrate a process and a product of the invention employing an immobilized, i.e., insolublized, photoreactive neutral random copolymer under layer to define regions where advantageous formation of self assembled structures in the overlying diblock film will occur. By "neutral," we mean a random copolymer under layer having a surface property required to provide a null preference between the phases of the diblock copolymers and facilitates the desired film formation. The "immobilized photoreactive neutral random copolymer" comprises the random copolymer underlayer having some areas of neutral surface energy relative to the overlying diblock copolymer where we desire the self assembly to occur. This underlayer is immobilized because the diblock copolymer is applied on top of it. The "regions of advantageous formation of self assembled structures" comprise regions where we desire to have the self assembly occur.

FIG. 6a to FIG. 6h of FIG. 6 comprise side elevations in cross section of an electronic component that schematically illustrate a process and a product of the invention of employing an immobilized photoreactive neutral random copolymer that changes polarity or surface energetics upon photolysis, thereby defining the areas in which advantageous formation of the self-assembled structure in the overlying diblock film will occur. Surface energetics comprise changes in the surface energy of a film. This can be done by changing the molecular structure of the surface through crosslinking, deprotection reactions, or molecular rearrangements. By "changes polarity" we mean changes in the overall solvation capability (solvation power) in relation to the individual diblock components which depends on the action of all possible, nonspecific and specific, intermolecular interactions between the blocks and generally implies changes in the lipophilic or hydrophilic nature of the material.

FIG. 7a comprises a side elevation in cross section illustrating an embodiment of the invention wherein a random copolymer film is attached on a silicon oxide substrate forming what is known as a "polymer brush". FIG. 7b comprises side elevations in cross section illustrating an embodiment of the invention wherein a random copolymer film immobilized or attached on a silicon oxide substrate is exposed with actinic radiation through a mask followed by coating the exposed film with a diblock copolymer and producing domains of self aligned structures. Actinic radiation comprises, e.g., ultraviolet light (UV), deep ultraviolet light (DUV), electron or ion beams or x-rays as further described by Breyta et al. U.S. Pat. No. 6,794,110, or other radiation as described by Chen et al. U.S. Pat. No. 6,303,263. FIG. 7b also schematically illustrates an electronic component and a polarity reversal process of the invention as well as an intermediate product produced thereby, whereas FIG. 7c illustrates one of the chemistries utilized in the process of the invention.

FIG. 8 comprises a side elevation in cross section comparing the process of the invention illustrated in FIG. 5 with the process of the prior art illustrated in FIG. 4.

BRIEF DESCRIPTION OF THE INVENTION

The invention comprises using a diblock copolymer film in a self assembly step for the manufacture electronic components such as semiconductor chips, semiconductor arrays or wafer or IC electronic components and other components such as but not limited to micro-electro-mechanical (MEMS) components. The diblock copolymer film is placed on a random copolymer film on a substrate operatively associated with the electronic component and the diblock copolymer film wherein the surface energy requirements of the random copolymer film are tailored by use of a photolithographic process prior to the self assembly step. By prior deterministic control over regional surface properties of the random copolymer film, domains of the diblock copolymer film form only in predefined areas. This approach offers simplified processing and a precise control of regions where domain formation occurs.

Examples of these types of diblock copolymers comprise Poly (methyl methacrylate)-b-styrene; Poly(styrene-b-ethylene oxide); Poly(dimethylsiloxane-b-styrene); Poly(t-butyl (meth)acrylate-b-styrene). The thermal anneal sequence in some embodiments comprises a hotplate bake or oven anneal in which the coated substrate is brought up to or above the glass transition (Tg) temperature of the coated film for a determined amount of time. Above the Tg the polymer is mobile and is allowed to achieve the "minimum energy" configuration which is determined by the diblock copolymer composition and the respective surface energies and interfacial energies of the individual blocks, as well as the substrate's surface energy/interfacial energy. No chemical changes happen in the above films, with the exception that in some instances, the polymer can undergo chemical changes in the proximity of acid and/or when exposed to elevated temperature.

In one embodiment, an energetically neutral random copolymer capable of changing surface energy with lithographic processing in a manner unfavorable to formation of self assembled regions is cast on a substrate. The film may have a post-application bake to drive off excessive solvent and immobilize the film for example by crosslinking or covalently bonding to the substrate. Regions of the film are then exposed to actinic radiation (as described herein) and then optionally post-exposure baked to define the regions that are to remain favorable to formation of the desired domains. We apply the diblock polymer to this film, followed by an optional thermal anneal sequence that ramps above the film's glass transition temperature, which may be less than the diblock copolymer in its unplasticized state. Optionally the post-exposure bake of the photolyzed random underlayer can occur during the thermal anneal sequence for the applied diblock layer.

By energetically neutral, we mean a surface energy that has a null preference relative to either diblock phase. An example comprises a random copolymer of the two monomers that comprise the two monomer units in a diblock copolymer. This definition is generic in that it applies to all diblock copolymers. The surface energy properties of any block of a block copolymer can be determined from the equivalent homopolymer. The response of the surface energy properties to compositional changes can be mapped to determine the point at which the interfacial energy of the blocks of the diblock copolymer and the random copolymer become equivalent. At this intersection, the neutral surface is defined. Non-idealities always exist and will require some deviation from the theoretical optimum and we do not constrain our invention to the compositional requirement of having identical monomer units in both the random and diblock films.

The exposed regions of the random copolymer film then undergo a chemical reaction, typically with a short post-exposure bake, promoting a chemical reaction comprising the deprotection of a protecting group in one of the monomer units. For example, an acidic deprotection may occur in a film comprising poly(t-butoxycarbonyloxy-styrene), poly(t-butoxystyrene) or poly(t-butyl(meth)acrylate) and a photo acid generator ["PAG"] which causes the desired domain orientation in the overlying diblock film to be disrupted. The regions with the deprotected regions are now more polar than the remaining regions that still contain the protecting groups. A diblock polymer containing the less polar protected monomer units, for example, would tend to form the desired domains in areas overlying the still-protected random copolymer.

Photolysis in this case causes changes in polarity or surface energy in selected regions of the underlying film which are unfavorable to formation of the desired self assembled structure. "Changes in polarity" comprise differences in the hydrophilic versus lipophilic nature of a material. A material with increased polarity tends to be more hydrophilic. The "changes in surface energy" we refer to comprises differences in the interaction between the forces of cohesion and the forces of adhesion of a material's surface which, in turn, dictate the nature of the interfacial interaction between two materials in contact. We find that the energy neutral surface produces one morphology in the diblock copolymer, e.g., cylinders as shown in FIG. 6, elements 6-121 and 6-122 and another morphology, e.g. worm-like structures in the photolyzed regions.

The imaging comprises either positive or negative tone processes. The random copolymer film is allowed to cool and then developed by applying a film of a diblock copolymer over the imaged random copolymer underlayer to reveal a combined self assembled region. The term "combined self-assembled region" refers to the pattern that combined the photolytically or other deterministic patterning process pattern of the random copolymer film neutral surface, and the self-assembled pattern of the diblock copolymer film that forms over the pattern of the random copolymer film neutral surface.

In a modification to the above embodiment the energetically neutral random copolymer capable of changing surface energy with lithographic processing is cast on a substrate and then photolyzed to define regions desired surface energy. In a subsequent step the whole film is then immobilized by thermal crosslinking or attached to the substrate by a subsequent heating step which also serves to concurrently cause deprotection in the photolyzed regions. We then apply and treat the diblock copolymer as described above.

In another embodiment we employ appropriate lithographic processing to prepare a substrate operatively associated with a random copolymer film capable of attaining surface neutrality to a given diblock composition in a manner favorable to formation of self assembled regions. We define the term "surface neutrality" in the same way as the previously described "energetically neutral random copolymers." "Lithographic processing" comprises lithographic processes known in the art, for example the processes described by Chiu et al., "Optical Lithography" *IBM Journal of Research and Development*, Vol. 41, No. 1/2 November 1997, http://researchweb.watson.ibm.com/journal/rd/411/chiu.html and Mack, C. A. "30 Years of Lithography Simulation," (2005) http//www.lithoguru.com/scientist/lithobasics.html. Mack refers to the early work of Dill and his team at IBM who published the first account of lithography simulation in this regard and the four papers published by them in 1975. Mack also refers to subsequent publications that show further developments in the field.

The film may have a post-application bake to drive off excessive solvent and to immobilize the film, for example, by crosslinking or covalently bonding to the substrate. The film is then exposed to actinic radiation (as described herein) and then optionally a, post-exposure bake to define the regions that are to become favorable to formation of the desired domains. We apply the diblock polymer to this, followed by an optional thermal anneal sequence that ramps above the film's glass transition temperature, which may be less than the diblock copolymer in its unplasticized state. Optionally the post-exposure bake of the photolyzed random underlayer can occur during the thermal anneal sequence for the applied diblock layer.

The film is then allowed to migrate into the desired orientation, e.g., a vertically oriented array of columns after which it is patterned by selective exposure to an actinic light source to generate an acid in either the exposed or unexposed area or areas, and then baked at a temperature that allows a chemical reaction to occur selectively. Typically, the exposure with a short post-exposure bake promotes a chemical reaction comprising the deprotection of a protecting group or the crosslinking of the polymer's backbone. For example, an acidic deprotection may occur in a film comprised of poly(t-butoxycarbonyloxy-styrene), poly(t-butoxystyrene) or poly(t-butyl(meth)acrylate) and a photo acid generator ["PAG"] does not allow for film orientation to be disrupted.

A diblock copolymer film is cast over the random copolymer film. The film may be subsequently treated by a post-application bake to drive off excess solvent and then subjected to a thermal anneal sequence that ramps above the film's glass transition temperature, which may be less than that of the diblock copolymer in its unplasticized state. Optionally the post-exposure bake of the photolyzed random underlayer can occur during the thermal anneal sequence for the applied diblock layer. The imaging comprises either positive or negative tone processes. The film is allowed to cool and then developed to reveal a combined self assembled region. In this embodiment the applied diblock film has a composition that matches the surface energetics of the photolyzed region of the random underlayer.

The present invention allows for a photo-induced polarity switch that results in improved processability. Improved processability refers to the comparatively reduced manufacturing steps required to achieve a desired pattern relative to conventional processing of "non-photo" patternable self-assembled layers.

In a modification of the above embodiment, the energetically neutral random copolymer capable of changing surface energy with lithographic processing is cast on a substrate and then photolyzed to define regions of desired surface energy. In a subsequent step the whole film is then immobilized by thermal crosslinking or attached to the substrate by a subsequent heating step which also serves to concurrently cause deprotection in the photolyzed regions. The diblock copolymer is then applied and treated as described above.

In another embodiment, which is a modification of the above four embodiments, a chemical additive is provided in the random copolymer underlayer capable of changing surface activity/polarity so that self aligned domain formation is inhibited. This non-polymeric chemical additive blends with the diblock copolymer and may comprise a compound such as a deprotectable compound (e.g., t-butyl cholate) or a polarity switching material such as a diazonapthoquinone or a photoacid generator.

In another embodiment the random energy neutral underlayer copolymer is immobilized by utilizing a reactive co-monomer causing crosslinking in regions where self assembly is to take place in the diblock film. We can employ a glycidyl methacrylate in the polymer, which will cross-link when exposed to actinic radiation (as described herein) and/or in combination with art-known epoxy and other cross-linking agents and adjuncts such as alcohols, organic acids and the like. By "immobilized" we mean changed in a manner that prevents removal by a solvent or developer or intermixed with another material and by "photolyzed" we mean chemically changed by exposure to actinic radiation, sometimes referred to as photolysis.

The exposed regions typically will undergo a crosslinking reaction that is photolytically induced. An example comprises an acid-catalyzed crosslinking reaction that is induced by exposure of a photoacid generator such as an iodium salt or sulfonium salt combined with the polymer. The fixed region is insoluble in the "developer," comprising a solvent used to remove one portion of the exposed film. The region can be a negative tone film (rendered insoluble upon exposure) or positive tone (rendered soluble upon exposure).

In yet another embodiment the exposed regions of the energetically neutral underlayer undergo a condensation reaction that covalently bonds them to the substrate. This may occur by incorporating chemically reactive monomers into the copolymer that react with the substrate. Another method which forms a so called "polymer brush" structure incorporates a reactive end group at the terminus of the copolymer so that the end of the copolymer chain becomes attached to the substrate. An example would be a benzylic alcohol functional group condensing with the reactive silanol groups on a silicon dioxide substrate. The condensation reaction to form this silyl ether is catalyzed by strong acids, such as those that are generated by a photoacid generator that is incorporated into the film. A subsequent post-exposure bake followed by a solvent rinse removes the energy-neutral copolymer from the unphotolyzed regions exposing the substrate. Application of the diblock material followed by the annealing step results in formation of the desired morphologies only in the regions of substrate still coated by the immobilized random copolymer film.

Another embodiment comprises an energetically neutral random copolymer film that can be lithographically processed in either a positive or negative tone sense to allow removal in defined areas to control regions of self assembly. An example would be the use of a high activation energy deprotectable block (t-butyl methacrylate) in conjugation with a high thermally stable PAG that can be activated after the mobilizing bake which allows the assembly of the diblock into the proper configuration. Another means comprises bringing about a structural change or deprotection that causes the exposed region to change structure and consequently change the surface energy and thus either promote or inhibit the desired assembly. For example, we can use a material that changes from non-polar to polar such as t-butyl methacrylate that de-protects to form a polar methacrylic acid group, which is used in positive tone processes, however, the selection of the random copolymer in this embodiment depends on the composition of the diblock copolymer. In this embodiment the random neutral underlayer is applied to the substrate, then photolyzed and optionally baked to cause deprotection in the desired regions. A subsequent development can be used to remove one of the regions, for example aqueous base developer to remove areas where methacrylic acid was formed. The remaining film can be immobilized with a subsequent bake step and the diblock film applied atop this layer.

We employ either negative tone or positive tone materials as the random copolymer compound or composition. The negative tone random copolymer materials comprise a random copolymer with a reactive monomer for immobilization to form an energetically neutral surface, e.g., MAs, styrenic or vinylic materials. These compositions or compounds also utilize crosslinking monomer compounds or compositions to immobilize films, e.g., alkoxy silanes, epoxides or glycidyl MAs or reactive alcohols. These reactive monomers comprise monomers having a crosslinkable moiety or moieties that will both crosslink and react with the substrate, i.e., the surface of the electronic component precursor. The random copolymer compound or composition may also comprise a two component composition such as reactive monomers, e.g., styrenics, PHOST, alcohols, HEMA, HEPA, epoxides or GMA formulated with cross linking agents, e.g., melamines, glycourils, benzyl alcohols, azides, bis epoxides and equivalent epoxides.

The positive tone materials comprise the random copolymer compound or composition that incorporates a deprotectable monomer in order to allow the material to switch polarities. These deprotectable monomers comprise, e.g., t-Butyl methacrylate, (meth)acrylic acid, t-butoxycarbonyloxystyrene, t-butoxystyrene, hydroxystyrene, alkyl/arylsiloxystyrene or a brush copolymer film underlayer known in the art. PAGs are also used with the positive tone and negative tone materials.

The process of the invention in one aspect comprises the use of radiation to pattern a template for self assembly by use of a cross linked random copolymer film in which we create an energetically neutral surface in photolytically predefined areas. We employ PAGs and heat to immobilize this cross linked random copolymer film, subsequently apply a diblock copolymer film over it and form preferably cylindrical or lamellar domains in the diblock copolymer film over regions that were predefined in the random copolymer underlayer. We then use this process for manufacturing an electronic component such as a transistor, integrated circuit and the like or other components such as MEMS components.

DETAILED DESCRIPTION OF THE INVENTION

FIG. 1 illustrates the standard DD process in which an ILD shown as two layer PA1-110, PA1-120 is coated on the substrate PA1-100 in FIG. 1a. Typical ILD materials are inorganic glass such as silicon dioxide ($SiO_2$), organosilicate glass (OSG), fluorosilicate glass (FSG), combinations thereof along with porous versions of these which incorporate air voids into their physical structure. In FIG. 1 the substrate PA1-100 is typically also an ILD material. The via dielectric PA1-110 and the line level dielectric PA1-120 are shown separately for clarity of the process flow description. In general these two layers can be made of the same or different insulating films and in the former case applied as a single monolithic layer. A hard mask layer PA1-130 is optionally used to facilitate etch selectivity and to serve as a polish stop as described later. The writing interconnect network consists of two types of features: line features that traverse a distance across the chip; and the via features which connect lines in different levels together. Historically, both layers are made of an inorganic glass like silicon dioxide ($SiO_2$) or a fluorinated silica film deposited by plasma enhanced chemical vapor deposition (PECVD). These layers comprise the ILD layers.

In the DD process, the position of the lines PA1-150 and the vias PA1-170 are defined lithographically in photoresist layer PA1-140, depicted in FIG. 1a, FIG. 1b, and FIG. 1d, and transferred into the hard mask and ILD layers using reactive ion etching processes. The process sequence shown in FIG. 1 is called a line-first approach because the trench PA1-160 will house the line feature which is etched first as shown in FIG. 1c. After the trench formation, lithography is used to define a via pattern PA1-170 in the photoresist layer PA1-140 which is transferred into the dielectric material to generate via opening PA1-180 AS shown in FIG. 1d.

The DD trench and via structure PA1-190 is shown in FIG. 1e after the photoresist is stripped. This structure PA1-190 is coated with a conductor liner material or a conductor material stack PA1-200 that serves to protect the conductor metal lines and vias and as an adhesion layer between the conductor and the ILD. This recess is then filled with a conductive fill material PA1-210 such as copper which is electrolytically applied over the surface of the patterned substrate. Other processes can also be used such as chemical vapor deposition (CVD) and other metals can be used in lieu of copper such as Al or Au. The fill and liner materials are then chemically-mechanically polished (CMP) to be coplanar with the surface of the hard mask. FIG. 1f shows the structure at this stage. FIG. 1g depicts a capping material PA1-220 deposited over the metal or as a blanket film to passivate the exposed metal surface and to act as a diffusion barrier between the metal and any additional ILD layers deposited over them. Typical capping material PA1-220 comprises silicon nitride, silicon carbide and silicon carbonitride films. This process sequence is repeated for each level of the interconnects on the electronic component. Since two interconnect levels are defined to form a conductor inlay within an insulator by a single polishing step, the process is designated a dual damascene process.

FIG. 2 shows a substrate PA2-100 optionally coated with a random copolymer PA2-110 affixed to the surface, for example, by thermal curing and from which excess unbound copolymer is then removed. PA2-100 is typically a previously applied ILD material as described earlier. Layer PA2-110 is chosen from materials that will provide surface energy characteristics favorable for formation of the desired diblock domain morphology in layer PA2-120 which ultimately phase separates into domains PA2-121 and PA2-122. For example, if layer PA2-120 was comprised of a polystyrene-polymethyl methacrylate diblock copolymer the underlayer, PA2-110 might be a random copolymer of polystyrene-co-methyl methacrylate that has been affixed to the substrate. There is a wide choice of potential materials which can be utilized as diblock monomers and the ability to attain the desired surface energy characteristics for the desired domain formation in these diblocks is not necessarily restricted to the same set of monomers in the underlying random copolymer, although this is often the case.

A diblock copolymer PA2-120 is coated on the top surface of the random substrate stack as shown in FIG. 2a. The diblock copolymer PA2-120 is annealed with heat and/or solvents, and/or actinic radiation PA2-130 allowing for phase separation of the immiscible polymer blocks PA2-121 and PA2-122. The annealed film is then optionally developed by a suitable process such as immersion in a solvent that dissolves one polymer block and not the other and reveals a pattern PA2-123 that is commensurate with the positioning of one of the blocks in the copolymer. For simplicity in FIG. 2 the block is shown as completely removed although this is not required. With judicious choice of copolymer units the development step can be eliminated, for example if there is a large etch selectivity between copolymer units and one of the domains is therefore removed during reactive ion etch (RIE) processing.

Referring to FIG. 3, topography PA3-140 in a photoresist material PA3-130, both shown in FIG. 3a, is lithographically generated on a stack of materials PA3-120 (a random copolymer) and PA3-110 (a silicon dioxide layer) positioned on substrate PA3-100 comprising silicon or other layers of metallization. The material stack PA3-120 and PA3-110 can represent a single material or a stack of materials individually. In FIG. 3b, a diblock polystyrene-polymethylmethacrylate copolymer film PA3-150 is coated over the topography. In FIG. 3c, the film is annealed allowing for phase separation in two individual electronic components PA3-151 and PA3-152. In principal there may be two or more domains formed by the individual diblock components. In FIG. 3d a single domain of the diblock copolymer is optionally developed to reveal the pattern PA3-160. In principle the pattern can be within the trough or on top of the trough PA3-140 as shown in FIG. 3a. The diblock copolymer can be partially developed as well. The resulting pattern can then be transferred into the pattern stack to generate a pattern PA3-170 as shown in FIG. 3e for example by REI processing.

Referring to FIG. 4, a suitable underlayer PA4-110 is deposited and immobilized on a substrate PA4-100 as shown in FIG. 4a, followed by application of a diblock copolymer material PA4-120 as shown in FIG. 4b and subjected to conditions appropriate for self assembly to take place such as a thermal or solvent anneal as shown in FIG. 4c. Materials are chosen as described in FIG. 2.

To protect certain areas of the substrate from utilization of the structure just prepared, a so-called blockout mask can be utilized as illustrated in FIG. 4d through FIG. 4e. In FIG. 4d a photoresist PA4-130 is applied over the developed self assembled structure where PA4-121 is the undeveloped diblock domain region or the region having high etch selectivity relative to PA4-122. After standard photoresist processing, a structure as shown in FIG. 4f is obtained where only some regions PA4-126 of the self assembled domains are uncovered for subsequent processing. In FIG. 4g, the case where the film stack was subjected to a reactive ion etching step is shown, etching only occurs in regions PA4-128 where the diblock structure is uncovered. A subsequent step leaves the structure modified only in the regions where there was no blockout mask as illustrated in FIG. 4h. Although the blockout mask was applied in the process during the step illustrated in FIG. 4e, the blockout mask can also be applied as early as the step illustrated in FIG. 4c, depending on the compatibility of the photoresist and the diblock copolymer. FIG. 4d shows an optional development step to remove unwanted material PA4-122 in this example from one of the self assembled domains to leave a void or partial void PA4-123 if this will be beneficial or required for further processing of the substrate. Prior to this step an optional exposure of the self assembled diblock film to actinic radiation benefits the development by increasing the solubility of the domain which is to undergo development and/or decreasing the solubility of the domain which is to remain after development. For example, in the case of PMMA, exposure to deep ultraviolet radiation (DUV) or electron beam radiation causes chain scissioning and therefore an increase in dissolution rate while polystyrene is known to crosslink thereby decreasing solvent solubility. Therefore in the case of a polystyrene-diblock-polymethyl methacrylate copolymer there would be two advantageous effects of exposure to DUV or electron beam radiation, the increase in solubility of the PMMA block along with decreased solubility and solvent swelling of the polystyrene block. However, because of the high selectivity to certain RIE processes it is possible to transfer etch into some types of organic substrates without using an intermediate solvent develop step.

Accordingly, we provide as our invention materials and processes. The field of the invention comprises convolved self-assembled structures such as nanostructures, and the fabrication of such structures by processes such as deterministic patterning processing methods, e.g., deterministic photolithography, which comprises the use of a master, such as a photolithographic mask to direct self-assembly in a predetermined location. Ion beam etching and other etch techniques known in the art can also be employed.

FIG. 5 illustrates vertically oriented cylinders, or lamellae, only formed in regions where the energy neutral layer is immobilized on a suitable substrate, but other morphologies such as spherically-imbedded domains are possible. The material or materials employed in the "energy neutral layer" are similar to those described for FIG. 2 but with monomer or end group units that are capable of crosslinking or reacting with the substrate such as epoxides or benzyl and other alcohols or esters and by the inclusion of PAGs. In this example, a photoreactive random underlayer film PA5-100 is applied to a suitable substrate PA5-110 illustrated in FIG. 5a. This photoactive film will later define regions of suitable surface energy where domains will form or not. The material or materials employed in the "underlayer film" and the "substrate" are similar to those described for FIG. 2. Exposure of this film to actinic radiation as in FIG. 5b changes the reactivity or polarity of the underlayer in a way so as to define regions where the energy neutral underlayer will remain after processing as shown in FIG. 5c. This step can either be accomplished on a negative-tone or a positive-tone mode. The negative tone mode is illustrated in FIG. 5b and FIG. 5c. Thus on exposure to actinic radiation through mask 5-115, the underlayer is immobilized for example by crosslinking or by covalent bond formation to the substrate. This can be accomplished by the addition of a photoacid generator to the copolymer film which generates a strong acid on photolysis causing subsequent catalysis of the film-immobilizing crosslinking or bonding reaction in the exposed regions. There are a wide selection of known photoacid generators (PAGs) for example of the generic classes of the iodonium and sulfonium acid salts, nitrobenzyl sulfonates, and imidosulfonates. A subsequent development step removes the underlayer from the area where self assembly of an overcoated diblock copolymer is not to take place. It is possible to use the inverse tone where the underlayer film will be removed from areas of the substrate where actinic light irradiated the film.

FIG. 5d shows the application of a diblock copolymer film capable of self assembly on the lithographically-defined regions of neutral energy. The composition of the copolymer is as described for FIG. 2. Self assembly takes place either spontaneously or after further processing such as a thermal or solvent anneal, as is the case for FIG. 5e. As noted previously the film is optionally subjected to a development step, providing a structure as illustrated in FIG. 5f. Further processing such as a reactive ion etch can be applied to give a structure illustrated in FIG. 5g, and the resist stack can be stripped to leave the processed substrate as illustrated in FIG. 5h. The "resist stack" is everything above element 5-110 as illustrated and described in FIG. 5h.

In the case where the substrate 5-110 is a metal oxide such as a silicon dioxide ILD we can use a fluoride ion etch to form openings 5-125. The remaining substrate layer 5-110 can possibly be used as a hard mask layer for further transfer into other underlying layers such as an organic transfer layer. Openings 5-125 may therefore be subsequently employed in the production of air bridges or air gaps in an underlying ILD (not shown) according to processes known in the art, such as those taught by Colburn et al. U.S. Pat. No. 6,930,034, as particularly described by element 3290 et seq. of Colburn et al. Additionally, Element 5-120 comprises the diblock copolymer employed as described above. Elements 5-122 [FIG. 5e] and 5-121 are the diblock domain regions formed over the energy neutral regions of remaining random copolymer film 5-100. Element 5-124 [FIG. 5f], comprises an opening provided by the removal of the domain 5-121 block of diblock copolymer 120, and openings 5-125 are provided by a fluoride ion etch after removal of the diblock copolymer 5-120 and the random copolymer substrate 5-100.

For the manufacture of other types of electronic components the pattern transfer provided by the RIE step of openings 5-122 into the substrate 5-110 providing the structures 5-125 may provide the desired working structure. Examples could be of MEMS components, channels for fluid transport or for other electronic components such as transistor structures.

In the example illustrated in FIG. 6, vertically oriented cylinders or lamellae form only in regions that were not exposed to actinic radiation (as described herein). FIG. 6a illustrates a suitable underlayer 6-100 applied and immobilized on a suitable substrate 6-110. The "underlayer" and the "substrate" are similar to those described for FIG. 2 but with monomer or end group units that are capable of crosslinking or reacting with the substrate, and by the inclusion of thermally stable PAGs. These monomer or end group units that are capable of crosslinking or reacting with the substrate comprise epoxides or benzyl and other alcohols or esters. Immobilization in this example and according to the invention can be achieved through insolubilization by thermal crosslinking of a suitable random copolymer or direct covalent bonding to the substrate, for example by a reactive end group or monomer unit and a substrate containing silanol units. Reactive groups suitable for crosslinking and/or substrate binding comprise epoxies, benzylic and other alcohols and esters. An optional photoacid generator with a thermal stability that is higher than the temperature required to cause crosslinking or film immobilization is incorporated into the random copolymer film formulation. The polymers in this example, but generally the polymers employed according to the invention, comprise any combination of diblock copolymers that will phase separate into the desired morphology, e.g., in the case for making a vertical air bridge we use vertically aligned cylinders with diblock copolymers known in the art for these processes. These diblock copolymers comprise those copolymers having the desired intrinsic matching of the surface energy requirements of the random copolymer to make the invention workable. Beyond that, the important part of making this selection is to provide a reactive end group on the random copolymer that will allow for binding to the substrate or incorporation of enough of an additional monomer unit type such as an epoxide which has the ability to crosslink the random copolymer and/or cause it to bind to the substrate.

We also form openings 6-124 in substrate 6-110 which we use in the production of air bridges or air gaps, in the same manner as described with reference to elements 5-110 and 5-125 of FIG. 5a to FIG. 5h.

Reactive end groups for these polymers and which are employed according to the present invention comprise those able to react with the substrate surface functionality (e.g., silanols) such as benzylic and other alcohols/esters and epoxides. The silanols exist on any silicon oxide surface. In the crosslinking scheme of the invention, it isn't even necessary to have the silanols. In practice these polymers could be in the form of so-called polymer brushes, where an end group of a polymer chain is a chemically reactive group such as benzyl alcohol or ester or alkyl siloxane groups which bond to a silicon surface containing silanol groups. Thus the polymer chains are conceptually envisioned to extend in a brush-like fashion from the substrate surface. We illustrate these polymer brushes in FIG. 7a as BABAABAR groups of a random A-B copolymer, where A and B comprise art-known random copolymer moieties such as styrene and methylmethacrylate. We subsequently describe these brushes in more detail.

The monomer units employed in either the random copolymer or the diblock copolymer used according to the invention are well known in the art. Optional crosslinking moieties used in either the random copolymer or the diblock copolymer are also well known in the art.

FIG. 6b illustrates the photoreactive random copolymer film irradiated by means of actinic light such as DUV through a mask 6-115 which determines where self assembly of the domains will form. In FIG. 6c the polarity and surface energy of regions 6-116 have been changed by exposure to actinic radiation, thereby making those regions unsuitable for the desired diblock domain morphology to form in layer 6-120 in FIG. 6d. Layer 6-116 comprises a region in the random copolymer film 6-100 that has undergone a polarity change by photolysis so that it is no longer energy neutral. An example of the photo reactive polymer film would be a copolymer containing a polymer unit comprising a tertiary butyl ester, which can catalytically deprotect upon photolytic formation of acid induced by a photoacid generator admixed with the copolymer. In this case the relatively nonpolar tertiary butyl ester will be transformed into a highly polar carboxylic acid group. We use the photo acid generator previously described with reference to element 5-115. In this particular example, the relatively lipophillic t-BuMA (t-butyl methacrylate), is converted into the very hydrophilic methacrylic acid, greatly changing the surface properties of the film. After applying the domain-forming diblock polymer 6-120, as illustrated in FIG. 6d, the film is subjected to solvent or thermal annealing to form self assembled domains 6-121 (e.g., domains of polystyrene) and 6-122 (e.g., domains of polymethylmethacrylate) only on regions having favorable surface energy 6-100, i.e., surface energy that will allow a desired self assembled morphology to form such as vertical cylinders for the manufacture of air bridges. Elevated temperature annealing of the diblock copolymer 6-120 takes place at temperatures above the glass transition temperature of the copolymer. An optional irradiation step and/or an optional development step, as illustrated in FIG. 6f, can be performed as needed to remove the material in one of the domains, thereby providing openings 6-124 in the structure. In one embodiment FIG. 6f, illustrates a development step comprising removal of the poly(methyl methacrylate) domains 6-121, thereby providing openings 6-124 in the structure. An optional irradiation step and/or an optional wet or RIE development step, as illustrated in FIG. 6f can be performed as needed to remove the material in one of the domains, thereby providing openings 6-124 in the structure. The self assembled masking structure can now be used, for example, to receive ion etch detail into the substrate 6-110 illustrated in FIG. 6g. FIG. 6h illustrates a subsequent lift-off chemistry procedure comprising the use of lift-off chemistry or RIE (reactive ion etching) known in the art to remove layers 6-100, 6-116, and 6-122, The self assembled masking structure can now be used, for example, to receive ion etch detail into the substrate 6-110 illustrated in FIG. 6g followed by stripping the resist stack and leaving the processed substrate illustrated in FIG. 6h.

This patterned substrate may be used as is for some types of components or it can be used as the hard mask for further pattern transfer into underlying layers. For example, for the formation of air gaps into a relatively thick ILD there may be a further transfer into a thick organic transfer layer underlying 6-110 which then becomes the masking layer for further transfer into the underlying thick ILD layer as taught in Colburn et al. U.S. Pat. No. 6,930,034, as particularly described by element 3290 et seq. of Colburn et al.

In FIG. 7a the polymer sequence BABMBAR exemplifies a random sequence of two monomers, A and B, comprising the random copolymer, and covers a wide range of copolymers, which we differentiate from a diblock copolymer (the domain-forming copolymer) which would be AAAAA-BBBBBB. As an example and with reference to FIG. 7 in one embodiment, A=polystyrene, B=t-butyl acrylate, and R=the linking group such as a benzyl ether (from reaction with a benzylic alcohol end group with the surface silanols). In FIG. 7a and FIG. 7b, as a working example, 7-100 comprises a silicon dioxide substrate containing silanol units; 7-110 comprises a polystyrene-co-t-butyl acrylate (random copolymer with admixed PAG); 7-120 comprises a random copolymer with acrylic acid forming region with surface energy unfavorable to domain formation; 7-130 comprises a polystyrene-block-poly t-butyl acrylate; 7-140 comprises a polystyrene block domain; 7-150 comprises a poly t-butyl acrylate block domain; 7-160 comprises a diblock copolymer with morphology that will not transfer into substrate with subsequent processing.

FIG. 7c illustrates one of the chemistries of the invention in which a styrene t-butyl methacrylate copolymer is de-esterified to form a styrene methacrylic acid copolymer in the polarity reversal process.

FIG. 8 compares the present invention, as shown by the seven steps of FIG. 5, with the prior art process shown by the eight steps of FIG. 4 and graphically illustrates that use of the present invention provides economies not realized by the prior art. Importantly, FIG. 8 shows that step 5e of FIG. 5 functions to replace three steps of the prior art, i.e., steps b, c, and d of FIG. 4.

An alternative embodiment comprises including an additive admixed in the random copolymer underlayer film capable of changing the surface energy or polarity of the random copolymer underlayer. This comprises, e.g., use of a diazonahthoquinone or photoacid generator which decomposes into very polar compounds on irradiation with actinic radiation and will change the surface properties of the underlayer dramatically and prevent the self assembly domains from forming in a vertical orientation in an upper diblock film that comprises a low surface energy diblock system. Other non-polymeric additives containing protected acid functionality such as t-butyl cholate can also be utilized.

Thus the invention comprises a process for using actinic radiation to pattern a template for polymeric self assembly by means of a diblock copolymer film in a self assembly step for the manufacture of an electronic or other component. The process comprises placing a diblock copolymer film on a random copolymer film substrate wherein the random copolymer film substrate is operatively associated with an electronic component precursor and the diblock copolymer film. We then tailor the surface energy of the random copolymer film prior to self assembly of the diblock copolymer film by means of a photolithographic process by employing actinic radiation to form a pattern in and provide deterministic control over regional surface properties of the random copolymer film. This not only promotes domain formation in the diblock copolymer film only in predefined areas, but also the formation of a self assembled structure in the diblock copolymer film.

The random copolymer comprises a photo definable energetically neutral copolymer film used to control regions of self assembly and the diblock copolymer film is coated on top of the diblock copolymer film to produce a combined self assembled pattern, wherein the random copolymer film is photolyzed to photo generate acid; heated to attach the random copolymer to the electronic component precursor and/or crosslink the random copolymer film; and optionally treated to remove a region of the film.

In another embodiment the random copolymer film comprises a copolymer film having labile protecting groups and is photolyzed to generate an acid and obtain a photolyzed random copolymer having at least one photolyzed area; and heated to attach the photolyzed random copolymer film to an electronic component precursor and change the polarity of the photolyzed region by deprotecting the labile protecting groups. The diblock copolymer film may be applied by spin coating; and may be annealed thermally or with solvent vapor or both; or optionally solvent developed.

In other aspects the invention comprises incorporating a reactive cross linking material or an additive into the energetically neutral random copolymer film to control surface energy by subsequent litho graphic processing, or changing the surface energy of regions of a random copolymer film bonded polymer brushes by lithographic processing to control where self assembly occurs. An important aspect of the invention comprises subsequently forming air bridge structures from the self assembled domains. Also, as noted previously, the copolymer film that contains reactive groups capable of undergoing thermal crosslinking may be subjected to negative or positive tone processing to provide a surface that promotes the formation of self assembled domains in the diblock copolymer film.

The random copolymers of the present invention may comprise so-called "deprotectable groups" for changing the random copolymer from a less polar copolymer to a more polar copolymer by removing these groups from the random co-polymer chain by actinic radiation or chemical means according to processes well known in the polymer art. These deprotectable groups comprise art-known tertiary esters, tertiary ethers, tertiary carbonates, benzylic esters, benzylic ethers, benzylic carbonates, secondary esters, secondary ethers, secondary carbonates, acetals, ketals, beta-alkylsilyl esters, beta-alkylsilyl ethers, beta-alkylsilyl carbonates, trialkyl silyl esters, trialkyl silyl ethers, alkyl aryl silyl esters, alkyl aryl silyl ethers, orthoesters, cycloalkyl esters, cycloalkyl ethers, cycloalkyl carbonates, t-BOC, and t-BuOPh.

Throughout this specification, and the drawings the inventors have set out equivalents, including without limitation, equivalent elements, materials, compounds, compositions, conditions, processes, structures and the like, and even though set out individually, also comprise combinations of these equivalents such as the two component, three component, or four component combinations, or more as well as combinations of such equivalent elements, materials, compounds, compositions conditions, processes, structures and the like in any ratios.

Additionally, the various numerical ranges describing the invention as set forth throughout the specification also comprises any combination of the lower ends of the ranges with the higher ends of the ranges, and any single numerical value, or any single numerical value that will reduce the scope of the lower limits of the range or the scope of the higher limits of the range, and ranges falling within any of these ranges.

The term "about" or "substantially" as applied to any claim or any parameters herein, such as a numerical value, including values used to describe numerical ranges, means slight variations in the parameter. In another embodiment, the terms "about," "substantial," or "substantially," when employed to define numerical parameter comprise, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit of zero or a miniscule number, e.g., 0.001. The terms "about," "substantial" and "substantially" mean that which is largely or for the most part entirely specified. The inventors also employ the terms "substantial," "substantially," and "about" in the same way as a person with ordinary skill in the art would understand them or employ them. The terms "written description," "specification," "claims," "drawings," and "abstract" as used herein refer to the written description, specification, claims, drawings, and abstract of the present application as originally filed and as subsequently amended. We intend the term "diblock copolymer" as used in the written description and the claims to also comprise triblock copolymers, and block copolymers containing four or five or more block units.

All scientific journal articles and other articles as well as issued and pending patents that this written description mentions including the references cited in such scientific journal articles and other articles, and such patents, are incorporated herein by reference in their entirety for the purpose cited in this written description and for all other disclosures contained in such scientific journal articles and other articles as well as patents and the aforesaid references cited therein, as all or any one may bear on or apply in whole or in part, not only to this written description, but also the abstract, claims, and appended drawings of this application.

Although the inventors have described their invention by reference to some embodiments, other embodiments defined by the doctrine of equivalents are intended to be included as falling within the broad scope and spirit of the foregoing written description, drawings, abstract of the disclosure, and claims as originally presented or subsequently amended.

We claim:

1. A process for patterning a template for polymeric self assembly of a polymer comprising a block copolymer film in a self assembly step for the manufacture of an electronic component, comprising:
    a) placing a polymer comprising a block copolymer film on a random copolymer film substrate wherein said random copolymer film substrate is operatively associated with an electronic component and said block copolymer film, wherein said random copolymer film is capable of undergoing a change of polarity and a consequent change of surface energy;
    b) prior to self assembly of said block copolymer film, changing the polarity of said random copolymer film and tailoring the surface energy thereof by actinic radiation or chemical means to form a pattern in and provide deterministic control over regional surface properties of said random copolymer film that promotes domain formation in said block copolymer film only in predefined areas; and
    c) forming a self assembled structure in said block copolymer film.

2. The process of claim 1 where said random copolymer film comprises a photo definable random copolymer film used to control regions of self assembly and said block copolymer film is coated on top of said random copolymer film to produce a combined self assembled pattern, comprising:
- a) photolyzing said random copolymer film to photo-generate acid;
- b) subsequently heating said random copolymer film to attach said random copolymer film to said electronic component and/or crosslinking said random copolymer film;
- c) optionally developing said random copolymer film to remove a region of said film after said heating step.

3. The process of claim 1 where said random copolymer film comprises a photo definable copolymer film used to control regions of self assembly and said block copolymer film comprises a diblock copolymer film which is coated on top of said random copolymer film to produce a combined self assembled pattern, comprising:
- a) heating said random copolymer film to attach said random copolymer film to said electronic component and/or crosslinking said random copolymer film;
- b) photolyzing said random copolymer film to photo-generate acid;
- c) optionally heating said random copolymer film to deprotect said random copolymer film.

4. The process of claim 1 wherein said random copolymer film comprises a copolymer film having labile protecting groups and said block copolymer comprise a diblock copolymer, wherein said process comprises:
- a) photolyzing said random copolymer film to generate an acid and obtain a photolyzed random copolymer having at least one photolyzed area; and
- b) heating said random copolymer film to attach said photolyzed random copolymer film to said electronic component and change the polarity of said photolyzed region by deprotecting said labile protecting groups.

5. The process of claim 2 comprising applying said block copolymer film over said random copolymer film wherein said block copolymer film comprises a diblock copolymer film, and:
- a) thermally annealing or solvent vapor annealing said diblock copolymer film or both;
- b) optionally solvent developing said diblock copolymer film.

6. The process of claim 2 comprising incorporating a reactive crosslinking material into said random copolymer film.

7. The process of claim 2 comprising incorporating a photoacid generator (PAG) into said random copolymer underlayer which causes deprotection or crosslinking and/or bonding to the substrate in the photolyzed regions of said random copolymer film underlayer.

8. The process of claim 7 wherein said photo acid generator is thermally stable and generates a strong sulfonic acid upon irradiation.

9. The process of claim 2 comprising incorporating an additive into said random copolymer film to control surface energy by subsequent lithographic processing to produce a photolyzed region in said random copolymer film, wherein said additive comprises a photo acid generator that converts to a strong acid upon exposure to actinic radiation and produces a more polar region in said photolyzed region to thereby destroy the energy neutrality of said photolyzed region and leave energy neutral regions in said un-photolyzed regions of said random copolymer film that promote the development of cylinders in said block copolymer.

10. The process of claim 2 comprising incorporating a non-polymeric additive into said random copolymer film to control surface energy by subsequent lithographic processing to produce a photolyzed region in said random copolymer film, wherein said additive comprises a deprotectable acidic functionality that converts to an acid species upon exposure to actinic radiation and produces a more polar region in said photolyzed region to thereby destroy the energy neutrality of said photolyzed region and leave energy neutral regions in said un-photolyzed regions of said random copolymer film that promote the development of cylinders in said block copolymer.

11. The process of claim 10 wherein said deprotectable acid functionality is based on materials comprising compounds having groups selected from tertiary esters, tertiary ethers, tertiary carbonates, benzylic esters, benzylic ethers, benzylic carbonates, secondary esters, secondary ethers, secondary carbonates, acetals, ketals, beta-alkylsilyl esters, beta-alkylsilyl ethers, beta-alkylsilyl carbonates, trialkyl silyl esters, trialkyl silyl ethers, alkyl aryl silyl esters, alkyl aryl silyl ethers, orthoesters, cycloalkyl esters, cycloalkyl ethers, cycloalkyl carbonates, t-BOC, and t-BuOPh.

12. The process of claim 11 wherein said acid comprises a cholate acid derivative.

13. The process of claim 2 wherein said random copolymer film comprises regions having surface energy subjected to lithographic processing to control where self assembly occurs, said regions comprising bonded polymer brushes.

14. The process of claim 2 comprising forming air bridge structures from said self assembled pattern.

15. The process of claim 2 wherein said random copolymer film comprises reactive groups capable of undergoing thermal crosslinking to negative tone processing to provide a surface that promotes the formation of self assembled domains in said block copolymer.

16. The process of claim 2 wherein said random copolymer film contains reactive monomers to allow removal of selected regions of said copolymer film, comprising subjecting said film to positive tone processing to remove selected regions of said copolymer film to provide a surface that promotes the formation of self assembled domains in said block copolymer.

17. The process of claim 2 wherein said random copolymer comprises groups comprising deprotectable groups for changing said random copolymer from a less polar copolymer to a more polar copolymer by removing said deprotectable groups from said random co-polymer chain by actinic radiation or chemical means, said deprotectable groups selected from tertiary esters, tertiary ethers, tertiary carbonates, benzylic esters, benzylic ethers, benzylic carbonates, secondary esters, secondary ethers, secondary carbonates, acetals, ketals, beta-alkylsilyl esters, beta-alkylsilyl ethers, beta-alkylsilyl carbonates, trialkyl silyl esters, trialkyl silyl ethers, alkyl aryl silyl esters, alkyl aryl silyl ethers, orthoesters, cycloalkyl esters, cycloalkyl ethers, cycloalkyl carbonates, t-BOC, and t-BuOPh.

18. The process of claim 2 wherein said random copolymer film partially comprises co-monomer units similar to that of said domain forming block copolymer.

19. An article of manufacture which is an electronic component having a template patterned by actinic radiation for polymeric self assembly of a block copolymer film in a self assembly step, comprising:
- a) a copolymer film placed on a random copolymer film substrate wherein said random copolymer film substrate is operatively associated with an electronic component and said block copolymer film;
- b) the surface energy of said random copolymer film being tailored by means of a photolithographic process by employing actinic radiation that forms a pattern in and provides deterministic control over regional surface properties of said random copolymer film to promote domain formation in said block copolymer film only in predefined areas; and c) a self assembled structure in said block copolymer film in said predefined areas.

20. The article of manufacture of claim 19 wherein where said random copolymer film comprises a photo definable random copolymer film used to control regions of self assembly and said block copolymer film comprises a diblock copolymer film which is coated on top of said random copolymer film to produce a combined self assembled pattern: and a) said random copolymer film includes photo-generated acid produced by photolyzing said random copolymer film;
b) said random copolymer film is attached to said electronic component and/or crosslinked by heating;
c) said random copolymer film comprises a region optionally removed by developing said film.

* * * * *